(12) United States Patent
Eom et al.

(10) Patent No.: US 10,347,351 B2
(45) Date of Patent: Jul. 9, 2019

(54) DISPLAY DEVICE AND METHOD OF DRIVING THE SAME

(71) Applicant: LG DISPLAY CO., LTD., Seoul (KR)

(72) Inventors: Eun Cheol Eom, Gimje-si (KR); Young Ho Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 87 days.

(21) Appl. No.: 14/586,432

(22) Filed: Dec. 30, 2014

(65) Prior Publication Data

US 2015/0187298 A1 Jul. 2, 2015

(30) Foreign Application Priority Data

Dec. 31, 2013 (KR) ........................ 10-2013-0169474

(51) Int. Cl.
*G11C 19/28* (2006.01)
*G09G 3/3266* (2016.01)

(52) U.S. Cl.
CPC ........... *G11C 19/28* (2013.01); *G09G 3/3266* (2013.01)

(58) Field of Classification Search
None
See application file for complete search history.

(56) References Cited

U.S. PATENT DOCUMENTS

| | | | | |
|---|---|---|---|---|
| 2007/0079192 A1* | 4/2007 | Kim | ..................... | G09G 3/3208 714/726 |
| 2007/0148793 A1* | 6/2007 | Yoshida | ............... | G09G 3/2096 438/14 |
| 2007/0242019 A1 | 10/2007 | Jung et al. | | |
| 2008/0116944 A1* | 5/2008 | Tobita | ..................... | G11C 19/28 327/142 |
| 2009/0207193 A1* | 8/2009 | Isobe | ....................... | G09G 3/22 345/690 |
| 2010/0060671 A1 | 3/2010 | Park et al. | | |
| 2011/0007040 A1* | 1/2011 | John | ........................ | G09G 3/20 345/204 |
| 2011/0142191 A1* | 6/2011 | Tobita | .................. | G09G 3/3677 377/64 |
| 2011/0222645 A1* | 9/2011 | Tobita | .................. | G09G 3/3677 377/78 |
| 2012/0001894 A1* | 1/2012 | Kim | ..................... | G09G 3/3677 345/213 |

(Continued)

FOREIGN PATENT DOCUMENTS

CN 101059941 A 10/2007

*Primary Examiner* — Lunyi Lao
*Assistant Examiner* — Benjamin X Casarez
(74) *Attorney, Agent, or Firm* — Birch, Stewart, Kolasch & Birch, LLP

(57) ABSTRACT

Discussed are a display device and a method of driving the same. The display device can include a panel in which a pixel is formed in each of a plurality of intersection areas between a plurality of gate lines and a plurality of data lines, a built-in gate driver built into a non-display area of the panel, and configured to include a shift register including a plurality of scan stages which output a scan pulse, and a timing controller configured to generate first to nth clocks, a reset signal, and a start signal. In initial driving of the built-in gate driver, the timing controller continuously supplies a pulse of the reset signal to the plurality of scan stages while a pulse of the nth clock and a pulse of the first clock to a pulse of the (n−1) clock are each output once in a first frame.

19 Claims, 8 Drawing Sheets

(56) References Cited

U.S. PATENT DOCUMENTS

| | | | | |
|---|---|---|---|---|
| 2012/0075259 A1* | 3/2012 | Chung | G09G 3/3266 | 345/204 |
| 2012/0098826 A1* | 4/2012 | Lee | G09G 3/003 | 345/419 |
| 2012/0113088 A1* | 5/2012 | Han | G09G 3/3674 | 345/212 |
| 2012/0163528 A1* | 6/2012 | Jang | G09G 3/3688 | 377/64 |
| 2012/0176417 A1* | 7/2012 | Jang | G09G 3/3266 | 345/690 |
| 2012/0194489 A1* | 8/2012 | Iwamoto | G09G 3/3685 | 345/204 |
| 2012/0327131 A1* | 12/2012 | Jang | G09G 3/3266 | 345/690 |
| 2013/0002306 A1* | 1/2013 | Chung | G09G 3/3266 | 327/108 |
| 2013/0002340 A1* | 1/2013 | Chung | H03K 17/687 | 327/434 |
| 2013/0002630 A1* | 1/2013 | Lee | G09G 3/3266 | 345/211 |
| 2013/0120346 A1* | 5/2013 | Chung | G09G 5/00 | 345/212 |
| 2013/0328495 A1* | 12/2013 | Woo | H05B 37/02 | 315/224 |
| 2014/0071114 A1* | 3/2014 | Kim | G11C 19/28 | 345/212 |
| 2014/0111092 A1* | 4/2014 | Kim | H05B 37/02 | 315/127 |
| 2014/0132162 A1* | 5/2014 | Kim | G09G 3/3266 | 315/161 |
| 2014/0145625 A1* | 5/2014 | Yamazaki | G09G 3/3677 | 315/172 |
| 2015/0015554 A1* | 1/2015 | Kim | G09G 3/3208 | 345/208 |
| 2015/0029174 A1* | 1/2015 | Otose | G09G 5/18 | 345/213 |
| 2015/0030116 A1* | 1/2015 | Horiuchi | G11C 19/28 | 377/2 |
| 2015/0138180 A1* | 5/2015 | Park | G09G 3/3233 | 345/212 |
| 2015/0187313 A1* | 7/2015 | Lee | G09G 3/3674 | 345/100 |
| 2015/0199932 A1* | 7/2015 | Ohara | G09G 3/3233 | 345/212 |
| 2015/0317936 A1* | 11/2015 | Yang | G09G 3/3677 | 345/100 |

* cited by examiner

DISPLAY DEVICE AND METHOD OF DRIVING THE SAME

CROSS-REFERENCE TO RELATED APPLICATIONS

This application claims the priority benefit of the Korean Patent Application No. 10-2013-0169474 filed on Dec. 31, 2013, which is hereby incorporated by reference as if fully set forth herein.

BACKGROUND OF THE INVENTION

Field of the Invention

The present invention relates to a display device, and more particularly, to a display device including a panel with a built-in gate driver and a method of driving the same.

Discussion of the Related Art

A flat panel display (FPD) device is applied to various electronic devices such as portable phones, tablet personal computers (PCs), notebook computers, monitors, etc. Examples of the FPD device include liquid crystal display (LCD) devices, plasma display panel (PDP) devices, organic light emitting display (OLED) devices, etc. Recently, electrophoretic display (EPD) devices are being widely used as one type of the FPD device.

As a type of FPD device (hereinafter referred simply to as a display device), organic light emitting display devices are self-emitting devices that self-emit light, and thus have a fast response time, high emission efficiency, high luminance, and a broad viewing angle.

A gate driver applied to an organic light emitting display device may be implemented as an integrated circuit (IC), and may be equipped in a panel configuring the organic light emitting display device. However, the gate driver may be directly provided in the panel in a gate-in panel (GIP) type.

Particularly, in a panel where thin film silicon formed of low temperature poly-silicon (LTPS) is formed, the gate driver using the GIP type outputs a scan pulse and various kinds of signals to the panel.

FIG. 1 is a waveform diagram showing a driving timing of a related art shift register, and FIG. 2 is a circuit diagram of the related art shift register.

The gate driver provided in the GIP type includes a shift register illustrated in FIG. 2. The shift register includes a plurality of stages, each of which may be configured as illustrated in FIG. 2. A signal Vout output from each of the stages is a scan signal transferred to a gate line which is formed in a panel.

The scan signal includes a scan pulse, having a turn-on voltage which turns on a switching element of each of a plurality of pixels connected to the gate line, and a turn-off signal for maintaining a turn-off state of the switching element during the remaining period of one frame.

Generally, each stage outputs the scan pulse once during one frame, and the scan pulse is sequentially output from the plurality of stages.

As illustrated in FIG. 2, each of the stages which sequentially output the scan pulse is turned on or off according to a logical state of a Q node. Each of the stages includes a pull-down transistor T6 and a pull-up transistor T7 which receive a fourth clock CLK4 to output the scan pulse when being turned on.

The pull-up transistor T7 is connected between the pull-down transistor T6 and a high-level voltage VGH terminal, and when the pull-down transistor T6 is turned on, the pull-up transistor T7 is turned off. When the pull-down transistor T6 is turned off, the pull-up transistor T7 is turned on, and outputs the turn-off signal.

For example, when the shift register operates by using four clocks CLK1 to CLK4, as shown in FIG. 1, the fourth clock CLK4 and a reset signal QRST are simultaneously input to the stage so as to reset the Q node and the shift register.

In this case, as illustrated in FIG. 3, the Q node may not normally be reset in an initial operation section of the shift register.

FIG. 3 is an exemplary diagram illustrating a state in which the Q node is not normally reset in an initial operation of the related art shift register, and FIG. 4 is an exemplary diagram illustrating a configuration of a stage which is included in the related art shift register and outputs an emission signal EM.

Referring to FIG. 3, a load of the reset signal QRST is greater than that of the fourth clock CLK4, and thus, a reset transistor Tqrst turned on by the reset signal QRST may be turned on late. In this case, short circuit can occur (0V output).

In this case, the Q node and a QB node are not simultaneously reset, and for this reason, the shift register cannot normally be driven.

Causes of the above-described problems are as follows.

A size of the reset transistor Tqrst driven by the reset signal QRST is generally smaller than that of the pull-down transistor T6. A load is greatly applied to the reset signal QRST depending on the number of the scan pulses (1,280 scan pulses with respect to high-definition (HD) resolution)

Therefore, as shown in FIG. 1, when the reset signal QRST and the fourth clock CLK4 are simultaneously input to the stage, the pull-down transistor T6 is turned on prior to the reset transistor Tqrst. The fourth clock CLK4 can be output to the gate line before the Q node is reset. In this case, the pull-up transistor T7 is turned on by the QB node in an unknown state, and for this reason, output short circuit can occur.

As illustrated in FIG. 4, the above-described abnormal operation of the organic light emitting display device using the GIP type can occur even in a stage which outputs the emission signal EM.

That is, in the related art organic light emitting display device, when the shift register initially operates, the above-described abnormal operation can occur. Particularly, the abnormal operation can severely occur in a shift register of an organic light emitting panel formed of a plastic substrate.

In an organic light emitting panel formed of a glass substrate, performance is not very good in terms of a reliability of a thin film transistor (TFT). Also, as a size and resolution of the organic light emitting panel increase, a load applied to the organic light emitting panel increases, and for this reason, a driving characteristic of the shift register is unstable.

SUMMARY OF THE INVENTION

Accordingly, the present invention is directed to provide a display device and a method of driving the same that substantially obviate one or more problems due to limitations and disadvantages of the related art.

An aspect of the present invention is directed to provide a display device and a method of driving the same, which supply a reset signal, overlapping clocks supplied to a shift register in one frame, to a stage of the shift register when the shift register initially operates.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including: a panel in which a pixel is formed in each of a plurality of intersection areas between a plurality of gate lines and a plurality of data lines; a built-in gate driver built into a non-display area of the panel, and configured to include a shift register including a plurality of scan stages which output a scan pulse; and a timing controller configured to generate first to nth clocks, a reset signal, and a start signal, wherein in initial driving of the built-in gate driver, the timing controller continuously supplies a pulse of the reset signal to the plurality of scan stages while a pulse of the nth clock and a pulse of the first clock to a pulse of the n−1 clock are each output once in a first frame.

In another aspect of the present invention, there is provided a method of driving a display device including: generating first to nth clocks, a reset signal, and a start signal; and continuously supplying a pulse of the reset signal to a plurality of scan stages while a pulse of the nth clock and a pulse of the first clock to a pulse of the n−1 clock are each output once in a first frame, in initial driving of a built-in gate driver, wherein the built-in gate driver is built into a non-display area of a panel in which a plurality of gate lines and a plurality of data lines are formed, and includes a shift register including the plurality of scan stages which output a scan pulse.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
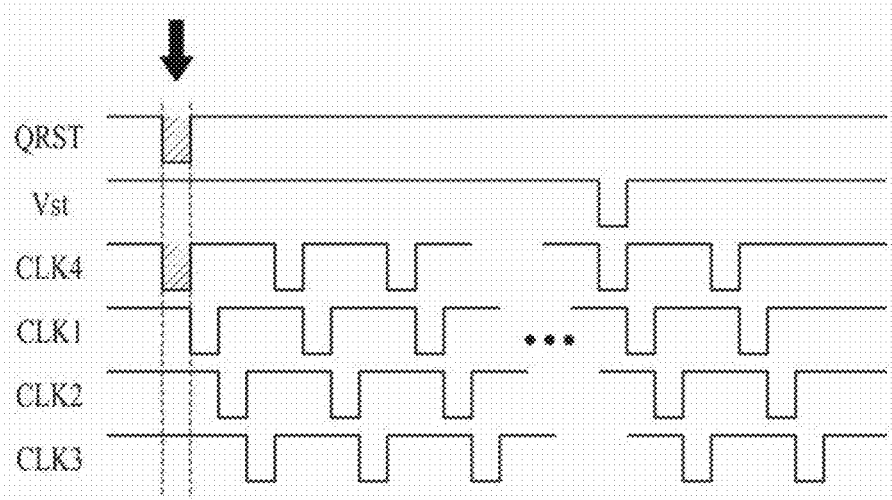
FIG. 1 is a waveform diagram showing a driving timing of a related art shift register.
Figure 2:
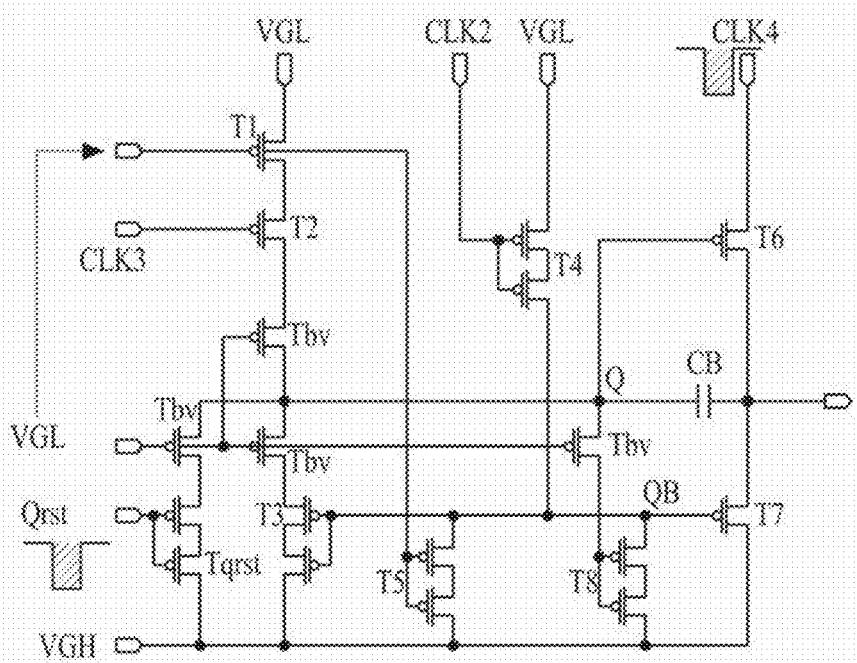
FIG. 2 is a circuit diagram of the related art shift register.
Figure 3:
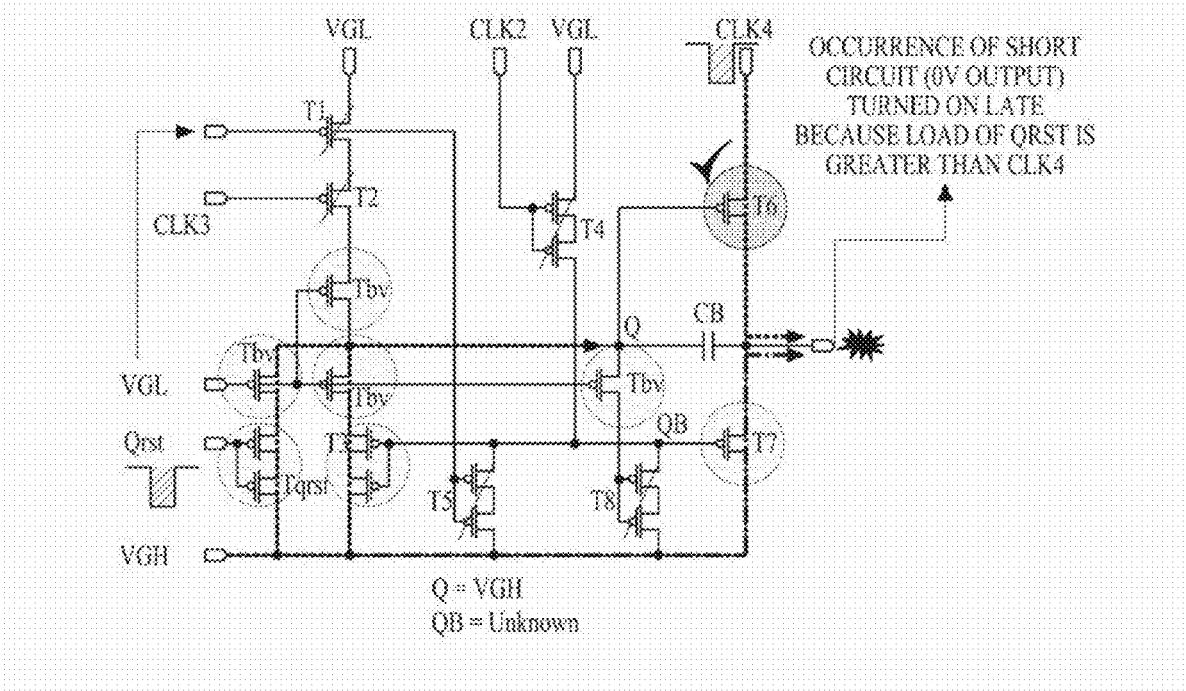
FIG. 3 is an exemplary diagram illustrating a state in which a Q node is not normally reset in an initial operation of the related art shift register.
Figure 4:
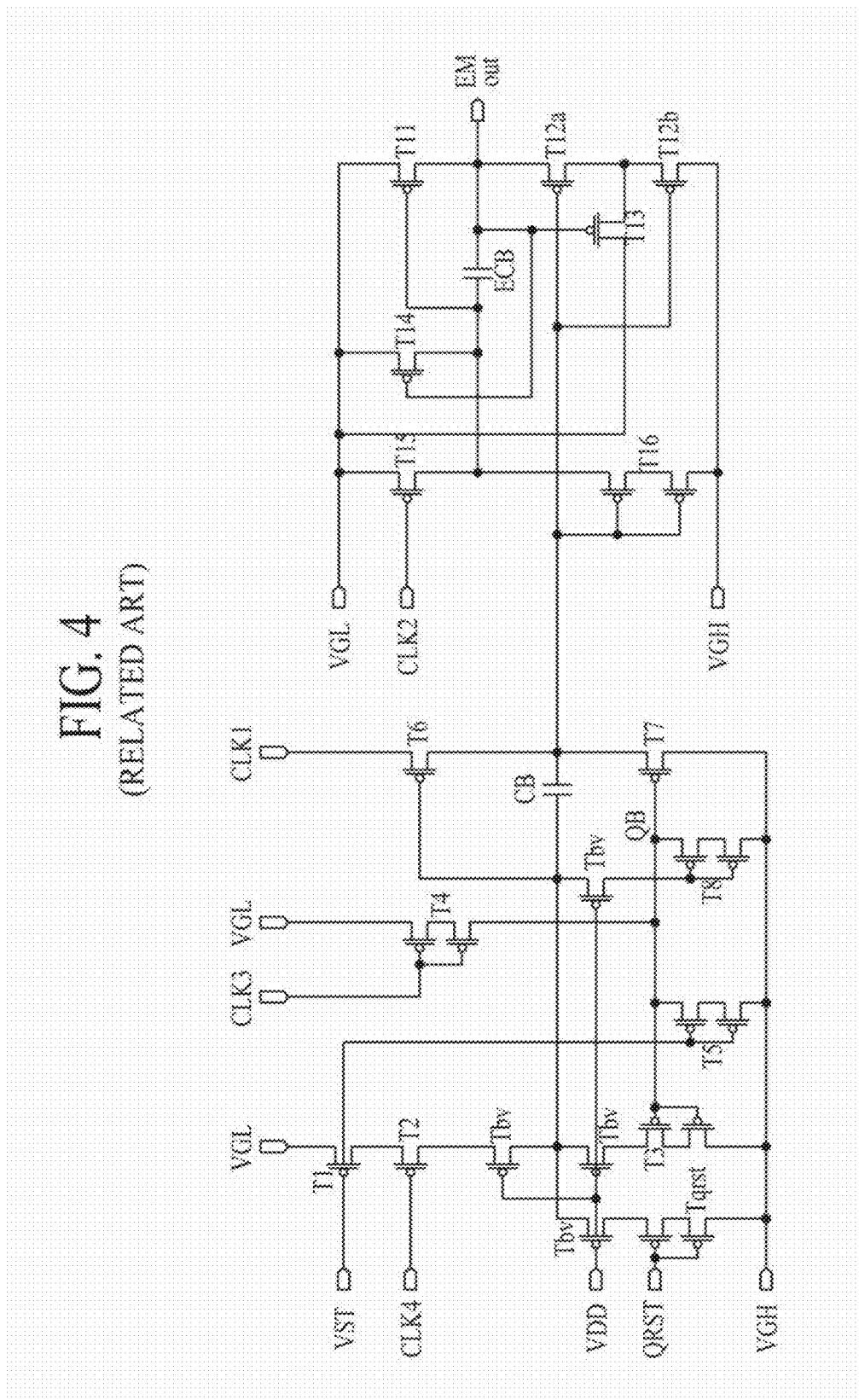
FIG. 4 is an exemplary diagram illustrating a configuration of a stage which is included in the related art shift register and outputs an emission signal.
Figure 5:
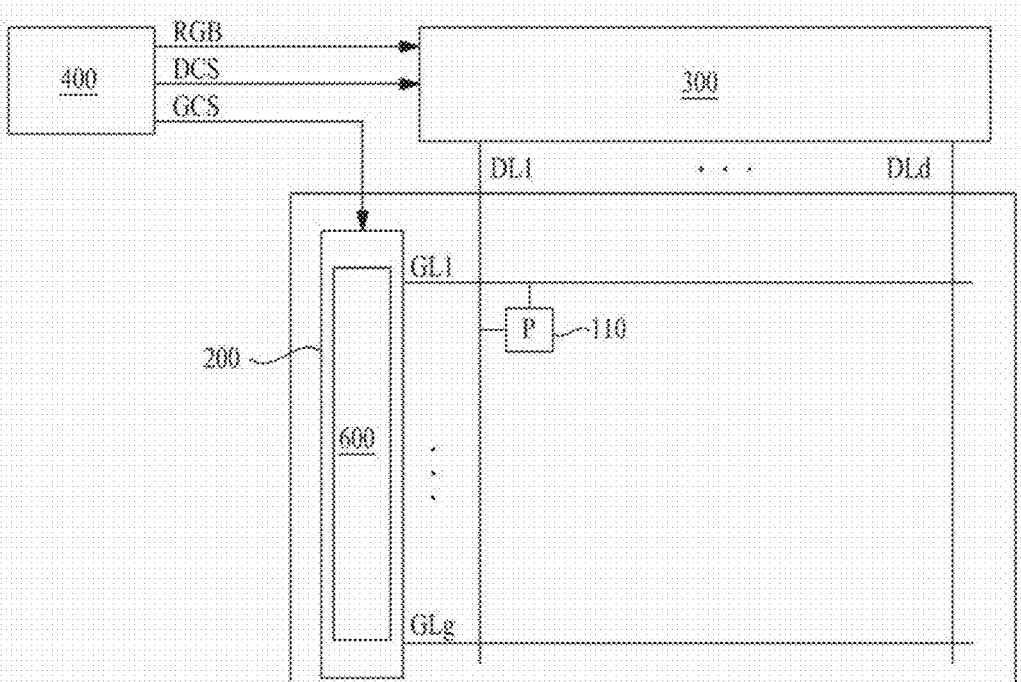
FIG. 5 is a diagram schematically illustrating a display device according to an embodiment of the present invention.

FIG. 5 is a diagram schematically illustrating a display device according to an embodiment of the present invention.

Referring to FIG. 5, the display device according to an embodiment of the present invention includes a panel 100, a gate driver 200, a data driver 300, and a timing controller 400. All the components of the display device in this and other embodiments are operatively coupled and configured.

A plurality of gate lines GL1 to GLg and a plurality of data lines DL1 to DLd are formed in the panel 100, and a pixel (P) 110 is formed in each of intersection areas between the plurality of gate lines GL1 to GLg and the plurality of data lines DL1 to DLd.

The gate driver 200 is built into a non-display area of the panel 100, and is configured with a shift register 600 including a plurality of scan stages which output a scan pulse.

The timing controller 400 generates first to nth clocks, a reset signal, and a start signal where n is an integer greater than 1. In initial driving of the gate driver 200, the timing controller 400 continuously outputs a pulse of the reset signal to the scan stages while a pulse of the nth clock and a pulse of the first clock to a pulse of the n−1 clock are each output once in a first frame.

The data driver 300 respectively supplies data voltages to the data lines DL1 to DLd formed in the panel 100 according to control by the timing controller 400.

Examples of the display device may include an LCD device, an organic light emitting display device, and other various kinds of displays. Hereinafter, however, the display device and a method of driving the same according to an embodiment of the present invention will be described in detail with an organic light emitting display device as an example. Also, the number of the clocks may be variously changed, but hereinafter, a case in which the number of the clocks is four will be described as an example.

In the panel 100, the pixel (P) 110 is formed in each of a plurality of areas defined by intersections between the plurality of gate lines GL1 to GLg and the plurality of data lines DL1 to DLd. The pixel 110 includes an organic light emitting diode (OLED), which emits light, and a pixel circuit that drives the OLED.

The OLED includes a substrate, an anode formed on the substrate, an organic emission layer formed on the anode, and a cathode formed on the organic emission layer.

The anode emits light with a current applied through a driving transistor which is formed in the pixel circuit, and an upper substrate is adhered to an upper end of the cathode. The anode may be formed of a transparent conductive material, for example, indium tin oxide (ITO). Also, the cathode may be formed of ITO.

The organic emission layer may include a hole transport layer, an emission material layer, and an electron transport layer. A hole injection layer may be formed between the anode and the hole transport layer, for enhancing an emission efficiency of the organic emission layer. An electron injection layer may be formed between the cathode and the electron transport layer.

A structure and function of the OLED are the same or similar to as those of an OLED applied to a related art organic light emitting display device, and thus, their detailed descriptions are brief or are not provided.

The pixel circuit may include a storage capacitor and at least two or more transistors, which are connected to the data line DL and the gate line GL and control the OLED.

The anode of the OLED is connected to a first power source of the pixel circuit, and the cathode is connected to a second power source of the pixel circuit. The OLED outputs light having certain luminance with a current supplied from the driving transistor.

The pixel circuit controls an amount of current supplied to the OLED. For example, when the scan pulse is supplied to the gate line GL, the pixel circuit controls an amount of current supplied to the OLED according to a data voltage Vdata supplied to the data line DL. The pixel circuit may be supplied with an emission signal EM in addition to the scan pulse.

A structure and function of the pixel circuit may be variously changed depending on a configuration and function of the pixel circuit. The structure and function of the pixel circuit are the same as those of a pixel circuit provided in a general organic light emitting display device, and thus, their detailed descriptions are not provided.

The data driver 300 converts image data, input from the timing controller 400, into data voltages. The data driver 300 supplies data voltages for one horizontal line to the data lines at every one horizontal period in which a gate pulse is supplied to the gate line. That is, the data driver 300 converts the image data into the data voltages by using gamma voltages supplied from a gamma voltage generator (not shown). Subsequently, the data voltages are respectively output to the data lines.

The data driver 300 shifts a source start pulse transferred from the timing controller 400 according to a source shift clock to generate a sampling signal. The data driver 300 latches the image data, which are input according to the source shift clock, according to the sampling signal. After converting the image data into the data voltages, the data driver 300 respectively supplies the data voltages to the data lines in units of a horizontal line in response to a source output enable signal.

To this end, the data driver 300 may include a shift register, a latch, a digital-to-analog converter (DAC), and an output buffer.

A structure and function of the data driver 300 are the same as those of a data driver applied to a general organic light emitting display device, and thus, their detailed descriptions are not provided.

The timing controller 400 outputs a gate control signal GCS used to control the gate driver 200 and a data control signal DCS used to control the data driver 300 by using a vertical sync signal, a horizontal sync signal, and a clock signal which are supplied from an external system (not shown).

The gate control signal GCS includes a gate start pulse GSP, a gate shift clock GSC, and a gate output enable signal GOE.

Particularly, the gate control signal GCS may include various kinds of control signals for controlling the shift register 600. For example, the gate control signal GCS may include the first to nth clocks, a reset signal QRST, and a start signal VST.

The data control signal DCS generated by the timing controller 400 may include a source start pulse SSP, a source shift clock signal SSC, a source output enable signal SOE, and a polarity control signal POL.

The timing controller 400 samples input video data, received from the external system, into digital image data. Subsequently, the timing controller 400 realigns the sampled data into frame-unit digital image data. The timing controller 400 supplies the realigned digital image data to the data driver 300.

That is, the timing controller 400 realigns the input video data supplied from the external system to transfer realigned digital image data to the data driver 300. The timing controller 400 generates the gate control signal GCS and the data control signal DCS by using the clock signal, the horizontal sync signal, the vertical synch signal, and the data enable signal DE which are supplied from the external system. The timing controller 400 supplies the gate control signal GCS to the gate driver 200, and supplies the data control signal DCS to the data driver 300. Hereinafter, the clock signal, the horizontal sync signal, and the vertical synch signal are simply referred to as a timing signal.

The timing controller 400 performs the following functions.

First, the timing controller 400 generates the first to nth clocks, the reset signal QRST, and the start signal VST. In initial driving of the gate driver 200, the timing controller 400 continuously outputs a pulse of the reset signal QRST to the scan stages while a pulse of the nth clock and a pulse of the first clock to a pulse of the n−1 clock are each output once in a first frame.

Due to the above-described function, a driving error does not occur in initial driving of the shift register.

Second, even after the pulse of the reset signal QRST is output, the timing controller 400 sequentially, continuously supplies the first to nth clocks to the scan stages during the first frame, respectively.

Third, the timing controller 400 maintains the start signal VST in a turn-off state during the first frame.

Fourth, before the gate driver 200 is turned off, the timing controller 400 supplies the pulse of the reset signal, which does not overlap the pulse of the first clock to the pulse of the nth clock, to the scan stages.

Fifth, in initial driving of the gate driver 200, the timing controller 400 continuously outputs a pulse of the reset signal QRST to input units of a plurality of emission stages while a pulse of the nth clock and a pulse of the first clock to a pulse of the n−1 clock are each output once in a first frame. Here, the emission stages output the emission signal EM to the panel 100.

Functions of the timing controller 400 will be described below in detail with reference to FIGS. 6 to 10.

The gate driver 200 is provided in a GIP type which is equipped in a non-display area of the panel 100. In this case, the gate control signal for controlling the gate driver 200 includes the reset signal QRST, the start signal VST, and the plurality of clocks CLK.

The gate driver 200 sequentially supplies the scan pulse to the gate lines GL1 to GLg of the panel 100 in response to the gate control signal input from the timing controller 400.

When the scan pulse is supplied to the gate lines, TFTs respectively formed in pixels of a corresponding horizontal line receiving the scan pulse may be turned on, and thus, an image may be output to each of the pixels. That is, the scan pulse has a turn-on voltage that turns on a switching element (a TFT) formed in each pixel.

The above-described function, particularly, may be performed by the shift register 600 configuring the gate driver 200.

That is, the shift register 600 sequentially supplies the scan pulse to the gate lines during one frame by using the start signal VST and the clocks CLK transferred from the timing controller 400. Here, one frame denotes a period in which one image is output by the panel 100.

The shift register 600 supplies a turn-off signal, which turns off the switching element, to the gate line during the remaining period of one frame in which the scan pulse is not supplied.

In the below description, a generic term for the scan pulse and the turn-off signal is the scan signal. That is, the scan signal includes the scan pulse, having the turn-on voltage which turns on the switching element of each pixel connected to the gate line, and the turn-off signal for maintaining a turn-off state of the switching element during the remaining period of one frame.

Moreover, the shift register 600 may include the plurality of emission stages which output the emission signal EM to the pixel circuit.

A configuration and operation method of the shift register will be described below in detail with reference to FIGS. 6 to 10.

Figure 6:
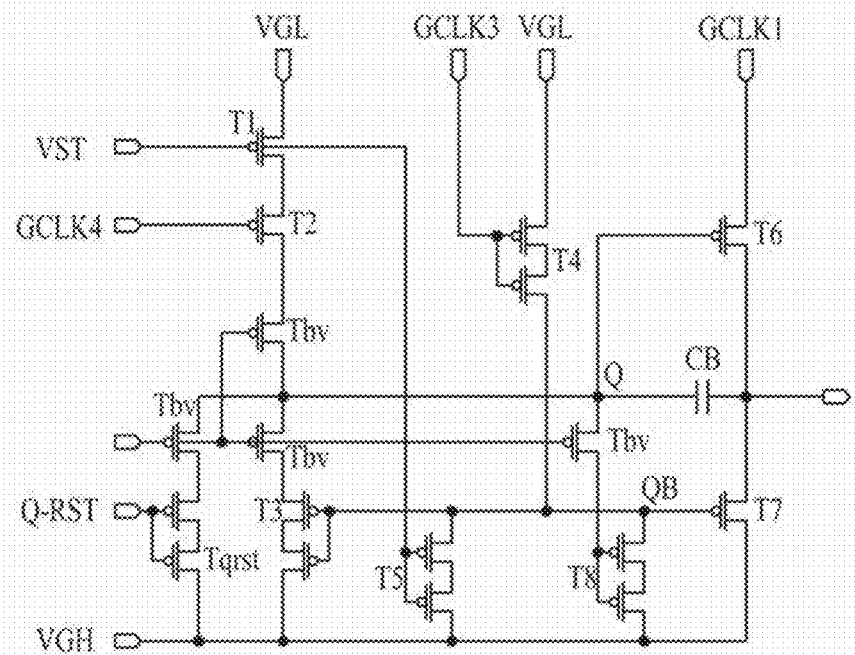
FIG. 6 is an exemplary diagram illustrating a configuration of a scan stage included in a built-in gate driver applied to the display device according to an embodiment of the present invention.
Figure 7:
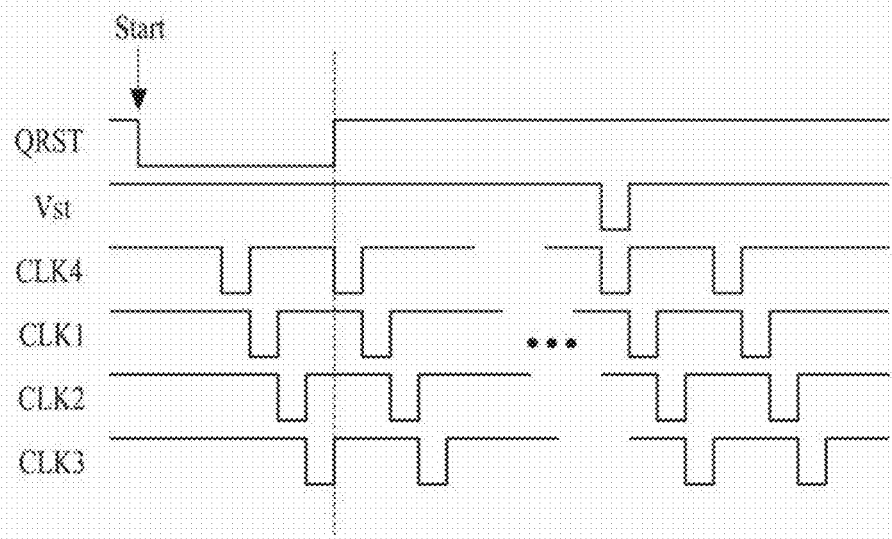
FIG. 7 is a timing chart showing waveforms of signals which are output from a timing controller applied to the display device according to an embodiment of the present invention when a gate driver is initially driven.
Figure 8:
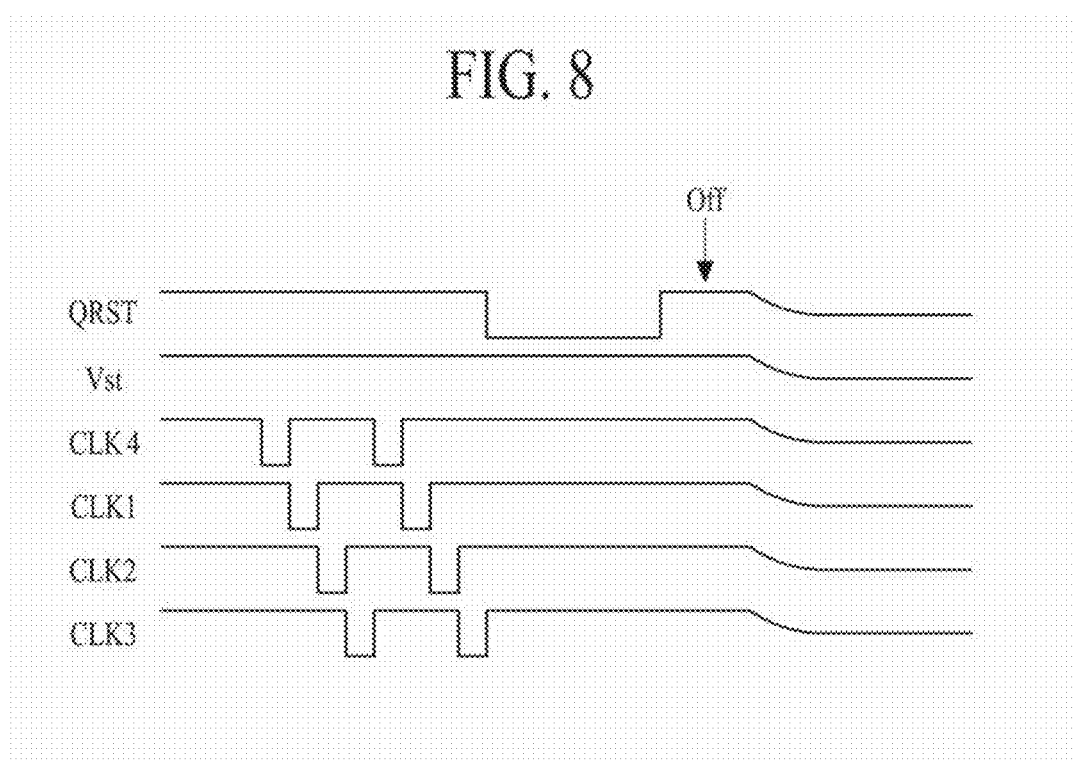
FIG. 8 is a timing chart showing waveforms of signals which are output from the timing controller applied to the display device according to an embodiment of the present invention before the gate driver is turned off.

FIG. 6 is an exemplary diagram illustrating a configuration of a scan stage included in a built-in gate driver applied to the display device according to an embodiment of the present invention. FIG. 7 is a timing chart showing waveforms of signals which are output from a timing controller applied to the display device according to an embodiment of the present invention when a gate driver is initially driven. FIG. 8 is a timing chart showing waveforms of signals which are output from the timing controller applied to the display device according to an embodiment of the present invention before the gate driver is turned off. Hereinafter, a shift register to which four clocks (first to fourth clocks) are input will be described as an example of the present invention.

The gate driver 200 applied to the display device according to an embodiment of the present invention includes the shift register 600, and a plurality of scan stages corresponding to the gate lines GL1 to GLg are provided in the shift register 600. That is, the scan stages sequentially outputs the scan pulse to the gate lines.

Referring to FIG. 6, each of the stages includes a pull-down transistor T6 and a pull-up transistor T7.

The pull-down transistor T6 is turned on/off according to a logical state of a Q node. When the pull-down transistor T6 is turned on, the pull-down transistor T6 receives one clock GCLK1 of the clocks to output the scan pulse.

The pull-up transistor T7 is connected between the pull-down transistor T6 and a high-level voltage VGH terminal. When the pull-down transistor T6 is turned on, the pull-up transistor T7 is turned off. When the pull-down transistor T6 is turned off, the pull-up transistor T7 is turned on, and outputs the turn-off signal.

Moreover, each of the stages includes a reset terminal which receives the reset signal QRST, a start terminal which receives the start signal VST, a low level terminal which receives a low-level voltage VGL, a high level terminal which receives a high-level voltage VGH, and a clock terminal which receives another clock GCLK4 that is output after the clock GCLK1 supplied to the pull-down transistor T6 is output.

First, when the gate driver 200 is initially driven with power supplied thereto, as shown in FIG. 7, the scan stage is reset by the pulse of the reset signal QRST, which is input along with the fourth clock, in a first frame.

Second, in the first frame, the timing controller 400 continuously supplies the pulse of the reset signal QRST to the scan stages while the pulse of the fourth clock and the pulse of the first clock to the pulse of the third clock are each output once.

For example, it is assumed that the timing controller 400 repeatedly outputs the first clock, the second clock, the third clock, and the fourth clock. In this case, as shown in FIG. 7, the timing controller 400 outputs the pulse of the reset signal QRST from before the fourth clock is output. The timing controller 400 continuously supplies the pulse of the reset signal QRST to the scan stage until the pulse of the fourth clock, the pulse of the first clock, the pulse of the second clock, and the pulse of the third clock are output.

The scan stage configured with a P-type transistor is illustrated in FIG. 6, and thus, pulses of the signals shown in FIG. 7 have a low level. Therefore, when the scan stage is configured with an N-type transistor, the pulses of the signals shown in FIG. 7 have a high level.

While the reset signal QRST has a low level, the pulse of the fourth clock CLK4 and the pulse of the third clock CLK3 are sequentially supplied to the stage. Therefore, a driving error does not occur in the stage.

For example, in the related art display device, when the shift register is initially driven, although the Q node of the stage is initialized by the high-level voltage VGH, leakage can occur through the Q node, the bvth transistor Tbv, the second transistor T2, and the first transistor T1. Also, there is very much possibility that the Q node fluctuates due to coupling based on a capacitance between the Q node and a node to which the first clock CLK1 is input. In this case, a reliability of a signal output from the stage is reduced, and when the stage is driven for a long time, a fluctuation of the Q node increasingly increases. Due to the fluctuation, short circuit can occur between an initial multi-output, the high-level voltage VGH, and the low-level voltage VGL.

To solve such a problem, the timing controller 400 applied to the present invention controls the stages so that a section in which the Q node is floated does not occur. That is, the timing controller 400 outputs the pulse of the reset signal QRST, which overlaps each of the pulses of the first to fourth clocks at least once, to the stages in a section where the Q node is reset, so that the section in which the Q node is floated does not occur.

That is, as shown in FIG. 7, the pulse of the reset signal QRST having a low level overlaps each of the pulses of the first to fourth clocks at least once.

Due to the above-described function, a driving error does not occur in initial driving of the shift register.

In this case, even after the pulse of the reset signal QRST is output, the timing controller 400 sequentially, continuously supplies the first to fourth clocks to the scan stages during the first frame, respectively. Also, during the first frame, the timing controller 400 maintains the start signal VST in a turn-off state. That is, as shown in FIG. 7, the start signal VST is supplied for the first time at a time when the first frame is ended and a second frame starts.

Third, before the gate driver 200 is turned off, the timing controller 400 supplies the pulse of the reset signal, which does not overlap the pulse of the first clock to the pulse of the nth clock, to the scan stages.

For example, as shown in FIG. 8, the timing controller 400 supplies the pulse of the reset signal to the scan stages before the external system and the gate driver 200 are turned off. In particular, the timing controller 400 outputs the pulse of the reset signal after the pulses of the first to fourth clocks CLK1 to CLK4 are all output. In this case, the reset signal has a pulse width equal to or greater than those of the pulses of the first to fourth clocks CLK1 to CLK4.

After an output of the pulse of the reset signal is stopped, the gate driver 200 and the external system are completely turned off.

Hereinabove, all the stages configuring the shift register have been described as performing the above-described operation. However, the above-described operation may be performed by only a first stage which is driven according to the start signal VST supplied from the timing controller 400.

Figure 9:
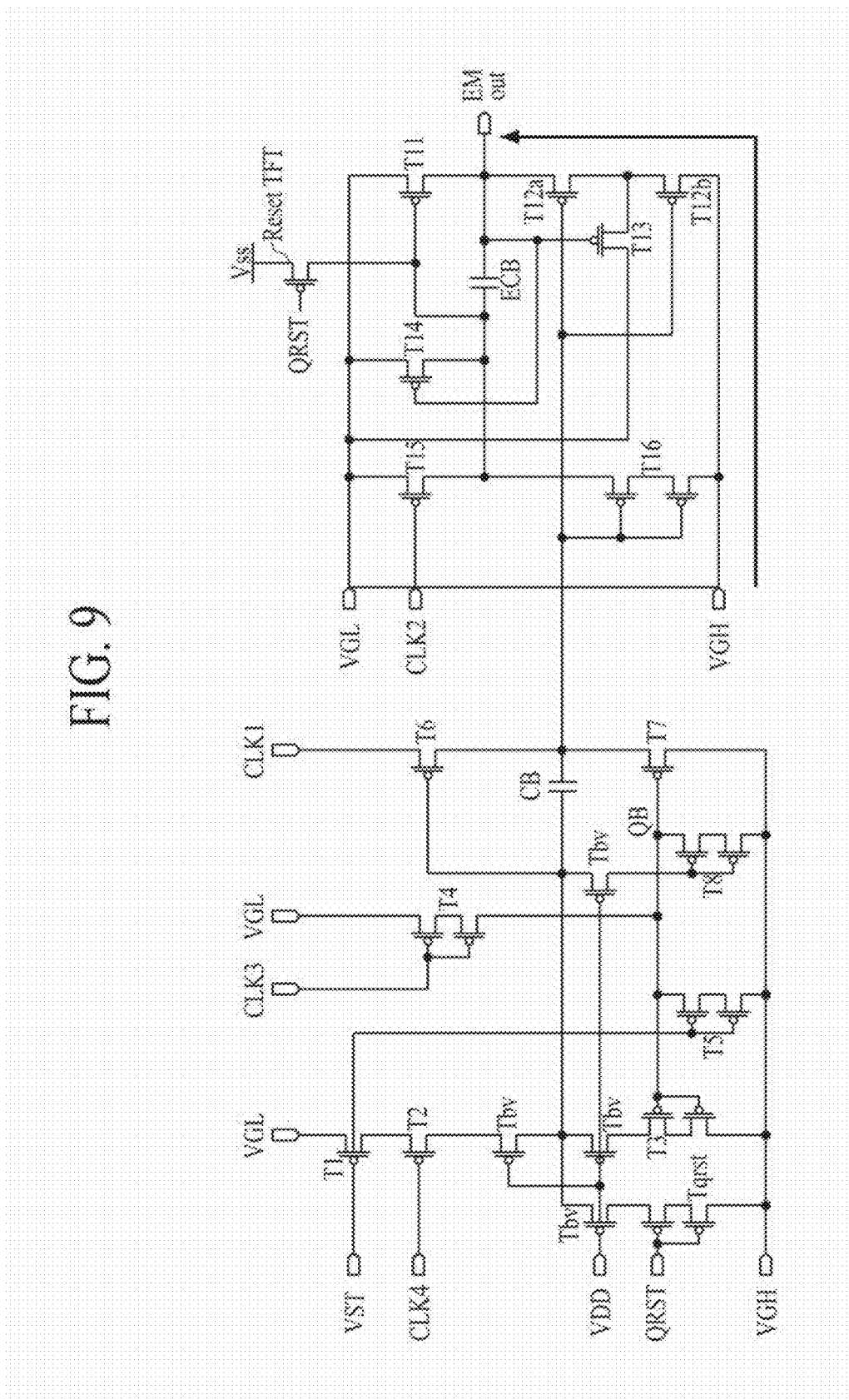
FIG. 9 is an exemplary diagram illustrating a configuration of an emission stage included in the built-in gate driver applied to the display device according to an embodiment of the present invention.
Figure 10:
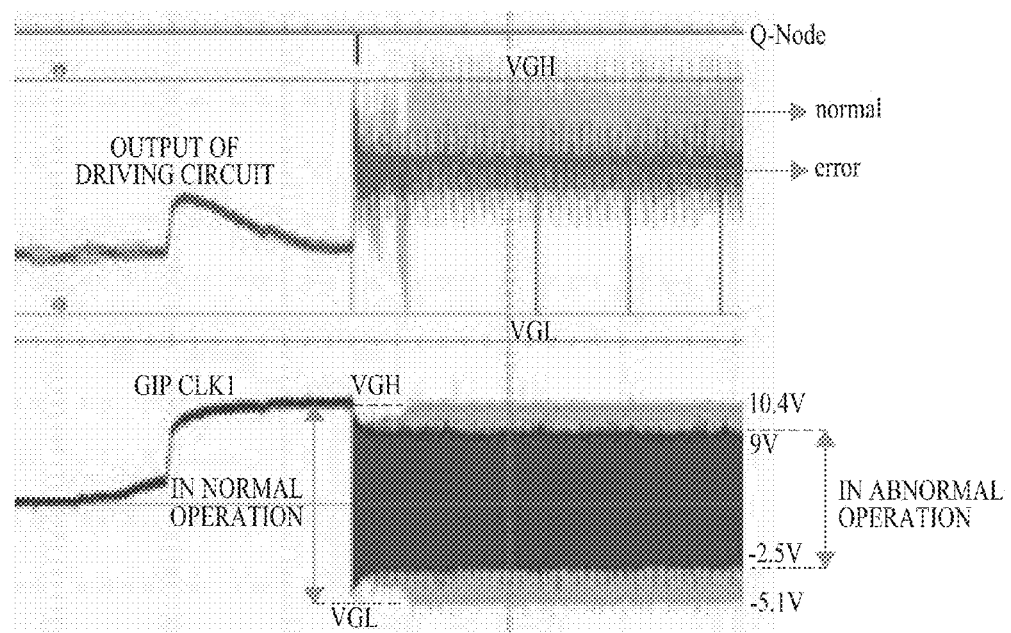
FIG. 10 is an exemplary diagram showing a simulation result of the display device according to an embodiment of the present invention.

FIG. 9 is an exemplary diagram illustrating a configuration of an emission stage included in the built-in gate driver applied to the display device according to an embodiment of the present invention, and FIG. 10 is an exemplary diagram showing a simulation result of the display device according to an embodiment of the present invention.

Referring to FIGS. 9 and 10, the gate driver 200 applied to the display device according to an embodiment of the present invention includes the shift register 600. The shift register 600 may include the plurality of emission stages that supply the emission signal EM to the pixel circuit, in addition to a plurality of scan stages corresponding to the gate lines GL1 to GLg.

Each of the emission stages, as illustrated in FIG. 9, includes an output unit and an input unit.

The output unit outputs the emission signal to the pixel circuits which are provided in the panel 100. The input unit is supplied with the start signal, the reset signal, and the clock, generates signals necessary to generate the emission signal, and transfers the signals to the output unit.

The input unit may be configured in the same type as that of the scan stage illustrated in FIG. 6. Alternatively, the input unit may use an output of the scan stage as-is. For example, the scan stage may output the scan pulse to the gate line, and the scan pulse may be supplied to the output unit of the emission stage.

That is, an output terminal provided between the pull-down transistor T6 and the pull-up transistor T7 of the scan stage is connected to the gate line. Also, the output terminal may be connected to an input terminal of the input unit.

However, the input unit of the emission stage may be provided in the shift register 600 independently from the scan stage.

The input unit of the emission stage is configured in the same structure as that of the scan stage, and thus, the above-described driving method may be applied to the input unit of the emission stage.

That is, as shown in FIG. 7, in initial driving of the gate driver 200, the timing controller 400 continuously outputs a pulse of the reset signal QRST to the input unit of each of the plurality of emission stages while a pulse of the fourth clock and a pulse of the first clock to a pulse of the third clock are each output once in a first frame.

Moreover, as shown in FIG. 8, before the gate driver 200 is turned off, the timing controller 400 supplies the pulse of the reset signal, which does not overlap the pulse of the first clock to the pulse of the fourth clock, to the scan stages.

Particularly, as illustrated in FIG. 9, in the emission stages, an emission reset transistor (Reset TFT) which is turned on by the reset signal QRST is formed in the output unit that outputs the emission signal.

For example, the emission reset transistor is connected between a low level terminal supplying the low-level voltage VSS and an emission pull-down transistor T11 outputting the emission signal EM. The reset signal QRST is input to a gate of the emission reset transistor.

According to the above-described embodiments of the present invention, when the external system and the gate driver 200 are powered off, a Q node of the output unit is initialized to a high level. Therefore, even if the external system and the gate driver 200 are again powered on, a malfunction caused by a charged electrical charge can be prevented.

That is, in a power-on operation of the related art display device, the high-level voltage VGH and the low-level voltage VGL are generated, and then, the clock is output, whereby initialization is performed. However, when a power-on/off operation is repeated, short circuit between an initial high-level voltage VGH and the low-level voltage VGL can occur due to a charged electrical charge which is stored in the Q node in a previous power-on operation.

However, as shown in FIG. 9, when the external system and the gate driver are powered off, the Q node of the output unit is powered off by using the emission reset transistor which is formed in the output unit of the emission stage. Therefore, when the external system and the gate driver are again powered on, a power-on operation is stably performed.

The above-described embodiments of the present invention will be briefly summarized as follows.

In a related art shift register, when a TFT of an output unit is initially turned on, an error occurs in an initial operation of the shift register, and for this reason, a collision occurs between a high-level voltage VGH and a low-level voltage VGL, causing a driving error of a panel.

On the other hand, in an embodiment of the present invention, the Q node and a QB node are initialized when the shift register is initially driven. Also, when the shift register is powered off, the Q node and the QB node are stably turned off. Also, when the panel is again powered on, a driving error which occurs in an initial operation is prevented.

First, a method that allows the reset signal to overlap the clocks when the Q node is initialized may be applied as a method that initializes the Q node when the shift register is initially driven.

Second, in an embodiment of the present invention, a method may be applied in which the Q node is initialized in power-off, and thus, even when the panel is again powered on quickly, power collision is prevented.

According to the above-described embodiments of the present invention, unstable states of the Q node and QB node of each of the stages can be removed in an initial power-on operation of the gate driver. Also, the Q node and the QB node may be set to a specific state. Therefore, a driving error can be prevented in driving after the shift register is turned on.

An effect of an embodiment of the present invention can be seen in a simulation result shown in FIG. 10. That is, referring to the simulation result shown in FIG. 10, it can be seen that a normal signal (an output of a driving circuit such as the scan pulse or the emission signal) is output from the stage applied to an embodiment of the present invention.

According to the embodiments of the present invention, when a shift register initially operates with power supplied thereto, the shift register is stably driven, thereby removing a failure such as a defective screen.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a panel in which a pixel is formed in each of a plurality of intersection areas between a plurality of gate lines and a plurality of data lines;
a built-in gate driver built into a non-display area of the panel, and configured to include a shift register including a plurality of scan stages which output a scan pulse; and
a timing controller configured to generate first to nth clocks, a reset signal, and a start signal,
wherein in initial driving of the built-in gate driver, the timing controller continuously supplies a pulse of the reset signal to the plurality of scan stages while a pulse of the nth clock and a pulse of the first clock to a pulse of the (n−1)th clock are each output once sequentially in a first frame, where n is an integer greater than 3 and the first frame is defined as a period in which one image is output by the panel,
wherein each of the plurality of scan stages is reset by the pulse of the reset signal,
wherein the pulse of the reset signal is a single low level pulse for turning on a transistor and overlapping each pulse of the first to nth clocks during the first frame, and including a starting edge that occurs before the pulse of the nth clock and an ending edge that occurs after a starting edge of the pulse of the (n−1)th clock,
wherein the first frame immediately follows a signal for a power-on operation of the display device, and the nth clock and the first clock to the (n−1)th clock each only output one pulse during the first frame while the pulse of the reset signal is continuously supplied,
wherein each of the plurality of scan stages is reset by the pulse of the reset signal, which is input along with the nth clock, in the first frame in initial driving, and
wherein the ending edge of the pulse of the reset signal is a rising edge that is aligned with a rising edge of the (n−1)th clock during the first frame, and the (n−1)th clock is supplied last among the first to nth clocks during the first frame in which the pulse of the nth clock and the pulse of the first clock to the pulse of the (n−1)th clock are sequentially supplied in order.

2. The display device of claim 1, wherein even after the pulse of the reset signal is output, the timing controller sequentially supplies the pulse of the nth clock and the pulse of the first clock to the pulse of the (n−1)th clock to the plurality of scan stages during the first frame, respectively.

3. The display device of claim 1, wherein the timing controller maintains the start signal in a turn-off state during the first frame.

4. The display device of claim 1, wherein before the built-in gate driver is turned off, the timing controller supplies a pulse of the reset signal, which does not overlap a pulse of the first clock to a pulse of the nth clock, to the plurality of scan stages.

5. The display device of claim 1, wherein,
the shift register comprises a plurality of emission stages configured to output an emission signal to the panel, and
each of the plurality of emission stages comprises an output unit configured to output the emission signal and an emission reset transistor configured to turn on according to the reset signal, wherein the emission reset transistor is formed in the output unit.

6. The display device of claim 5, wherein the output unit is connected to an output terminal of an input unit which is configured in the same type as a type of the scan stage.

7. The display device of claim 6, wherein in initial driving of the built-in gate driver, the timing controller continuously outputs the pulse of the reset signal to the input unit of each of the plurality of emission stages while the pulse of the nth clock and the pulse of the first clock to the pulse of the (n−1)th clock are each output once sequentially in the first frame.

8. A method of driving a display device, the method comprising:
generating first to nth clocks, a reset signal, and a start signal, where n is an integer greater than 3; and
continuously supplying a pulse of the reset signal to a plurality of scan stages while a pulse of the nth clock and a pulse of the first clock to a pulse of the (n−1)th clock are each output once sequentially in a first frame, in initial driving of a built-in gate driver,
wherein the built-in gate driver is built into a non-display area of a panel in which a plurality of gate lines and a plurality of data lines are formed, and includes a shift register including the plurality of scan stages which output a scan pulse,
wherein the first frame is defined as a period in which one image is output by the panel,
wherein each of the plurality of scan stages is reset by the pulse of the reset signal,
wherein the pulse of the reset signal is a single low level pulse for turning on a transistor and overlapping each pulse of the first to nth clocks during the first frame, and including a starting edge that occurs before the pulse of the nth clock and an ending edge that occurs after a starting edge of the pulse of the (n−1)th clock,
wherein the first frame immediately follows a signal for a power-on operation of the display device, and the nth clock and the first clock to the (n−1)th clock each only output one pulse during the first frame while the pulse of the reset signal is continuously supplied,
wherein each of the plurality of scan stages is reset by the pulse of the reset signal, which is input along with the nth clock, in the first frame in initial driving, and
wherein the ending edge of the pulse of the reset signal is a rising edge that is aligned with a rising edge of the (n−1)th clock during the first frame, and the (n−1)th clock is supplied last among the first to nth clocks during the first frame in which the pulse of the nth clock and the pulse of the first clock to the pulse of the (n−1)th clock are sequentially supplied in order.

9. The method of claim 8, further comprising:
before the built-in gate driver is turned off, supplying a pulse of the reset signal, which does not overlap a pulse of the first clock to a pulse of the nth clock, to the plurality of scan stages.

10. A display device comprising:
a panel having a plurality of gate lines and data lines;
a gate driver formed in a non-display area of the panel; and
a timing controller configured to generate first to nth clock signals, a reset signal and a start signal, where n is an integer greater than 3,
wherein the timing controller supplies a first pulse of the reset signal configured to overlap with the first to nth clock signals when the gate driver is turned on,
wherein the timing controller supplies a second pulse of the reset signal configured not to overlap with the first to nth clock signals when the gate driver is turned off,
wherein the timing controller is configured to continuously output the first pulse of the reset signal to a plurality of scan stages while a pulse of the nth clock signal and a pulse of the first clock signal to a pulse of (n−1)th clock signal are each output once sequentially during a first frame that is defined as a period in which one image is output by the panel,
wherein each of the plurality of scan stages is reset by the first pulse of the reset signal,
wherein the first pulse of the reset signal is a single low level pulse for turning on a transistor and overlapping each pulse of the first to nth clock signals during the first frame, and including a starting edge that occurs before the pulse of the nth clock signal and an ending edge that occurs after a starting edge of the pulse of the (n−1)th clock signal,
wherein the first frame immediately follows a signal for a power-on operation of the display device, and the nth clock signal and the first clock signal to the (n−1)th clock signal each only output one pulse during the first frame while the first pulse of the reset signal is continuously supplied,
wherein each of the plurality of scan stages is reset by the first pulse of the reset signal, which is input along with the nth clock signal, in the first frame in initial driving, and
wherein the ending edge of the first pulse of the reset signal is a rising edge that is aligned with a rising edge of the (n−1)th clock signal during the first frame, and the (n−1)th clock signal is supplied last among the first to nth clock signals during the first frame in which the pulse of the nth clock signal and the pulse of the first clock signal to the pulse of the (n−1)th clock signal are sequentially supplied in order.

11. The display device of claim 10, wherein the gate driver includes a shift register having a plurality of scan stages that respectively output a scan signal transferred to one or more gate lines on the panel, each scan signal containing at least one scan pulse having a turn-on voltage, which turns on a switching element of each of a plurality of pixels connected to the gate lines, and a turn-off voltage, which maintains a turn-off state of the switching element, and
wherein the gate driver is configured such that the reset signal and a fourth clock signal are not simultaneously received, such that a Q node and a QB node in the gate driver are initialized when the shift register is initially driven, and the Q node and the QB node are stably turned off when the shift register is turned off.

12. The display device of claim 11, wherein the timing controller is configured such that the reset signal and the fourth clock signal are not simultaneously output, such that the Q node and the QB node at the gate driver are initialized when the shift register therein is initially driven, and the Q node and the QB node are stably turned off when the shift register is turned off.

13. An apparatus comprising:
a display device circuit configured to receive gate control signals from a timing controller, the gate control signals including first to fourth clock signals and a reset signal,
wherein the display device circuit includes a reset transistor at an output end thereof and is configured to operate in accordance with a reset signal from the timing controller,
wherein the timing controller is configured to continuously output a pulse of the reset signal to a plurality of scan stages while a pulse of the fourth clock signal, a pulse of the first clock signal, a pulse of the second clock signal and a pulse of the third clock signal are each output once sequentially during a first frame,
wherein the display device circuit is configured such that the reset signal and the fourth clock signal are not simultaneously received, such that a Q node and a QB node at the output end are initialized when a shift register in the display device circuit is initially driven, and the Q node and the QB node are stably turned off when the shift register is turned off,
wherein each of the plurality of scan stages is reset by the pulse of the reset signal,
wherein the pulse of the reset signal is a single low level pulse for turning on a transistor and overlapping each pulse of the first to fourth clock signals during the first frame, and including a starting edge that occurs before the pulse of the fourth clock signal and an ending edge that occurs after a starting edge of the pulse of the third clock signal,
wherein the first frame immediately follows a signal for a power-on operation of the display device, and the first to fourth clock signals each only output one pulse during the first frame while the pulse of the reset signal is continuously supplied,
wherein each of the plurality of scan stages is reset by the pulse of the reset signal, which is input along with the fourth clock signal, in the first frame in initial driving, and
wherein the ending edge of the pulse of the reset signal is a rising edge that is aligned with a rising edge of the third clock signal during the first frame, and the third clock signal is supplied last among the first to fourth clock signals during the first frame in which the pulse of the fourth clock signal and the pulse of the first clock signal, the pulse of the second clock signal and the pulse of the third clock signal are sequentially supplied in order.

14. The apparatus of claim 13, wherein the display device circuit comprises a gate driver that includes the shift register having a plurality of scan stages that respectively output a scan signal transferred to one or more gate lines on a display panel, each scan signal containing at least one scan pulse having a turn-on voltage, which turns on a switching element of each of a plurality of pixels connected to the gate lines, and a turn-off voltage, which maintains a turn-off state of the switching element during a remaining period of one frame, and
wherein a first pulse of the reset signal that overlaps with the first to fourth clock signals is received when the gate driver is turned on, and a second pulse of the reset signal that does not overlap with the first to fourth clock signals is received when the gate driver is turned off.

15. The apparatus of claim 14, wherein each stage in the shift register comprises a pull-down transistor and a pull-up transistor configured to output the scan pulse upon being turned on in accordance with the fourth clock signal that is received.

16. The apparatus of claim 15, wherein the display device circuit is implemented in a display device having electroluminescence elements on a flexible or plastic substrate.

17. An apparatus comprising:
a display device circuit configured to output gate control signals used in controlling a gate driver and data control signals used in controlling a data driver, the gate control signals including first to nth clock signals and a reset signal, where n is an integer greater than 3,
wherein the display device circuit is configured to continuously output a pulse of the reset signal to a plurality of scan stages in a shift register of the gate driver while a pulse of the nth clock signal and a pulse of the first clock signal to a pulse of the (n−1)th clock signal are each output once sequentially during a first frame,
wherein the display device circuit is configured such that the reset signal and a fourth clock signal are not simultaneously output, such that a Q node and a QB node at the gate driver are initialized when a shift register therein is initially driven, and the Q node and the QB node are stably turned off when the shift register is turned off,
wherein each of the plurality of scan stages is reset by the pulse of the reset signal,
wherein the pulse of the reset signal is a single low level pulse overlapping each pulse of the first to nth clock signals and including a starting edge that occurs before the pulse of the nth clock signal and an ending edge that occurs after a starting edge of the pulse of the (n−1)th clock signal,
wherein the first frame immediately follows a signal for a power-on operation of the display device, and the nth clock signal and the first clock signal to the (n−1)th clock signal each only output one pulse during the first frame while the pulse of the reset signal is continuously supplied,
wherein each of the plurality of scan stages is reset by the pulse of the reset signal, which is input along with the nth clock signal, in the first frame in initial driving, and
wherein the ending edge of the pulse of the reset signal is a rising edge that is aligned with a rising edge of the (n−1)th clock signal during the first frame, and the (n−1)th clock signal is supplied last among the first to nth clock signals during the first frame in which the pulse of the nth clock signal and the pulse of the first clock signal to the pulse of the (n−1)th clock signal are sequentially supplied in order.

18. The apparatus of claim 17, wherein the display device circuit comprises a timing controller configured to generate the first to nth clock signals, to supply a first pulse of the reset signal that overlaps with the first to nth clock signals when the gate driver is turned on, and to supply a second pulse of the reset signal that does not overlap with the first to nth clock signals when the gate driver is turned off.

19. The apparatus of claim 18, wherein the display device circuit is implemented in a display device having electroluminescence elements on a flexible or plastic substrate.

* * * * *